United States Patent
Konno et al.

(10) Patent No.: US 12,038,576 B2
(45) Date of Patent: Jul. 16, 2024

(54) OPTICAL SCANNING DEVICE AND METHOD FOR MANUFACTURING THE SAME

(71) Applicant: Mitsubishi Electric Corporation, Tokyo (JP)

(72) Inventors: Nobuaki Konno, Tokyo (JP); Yoshiaki Hirata, Tokyo (JP); Takahiko Ito, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 599 days.

(21) Appl. No.: 17/417,385

(22) PCT Filed: Mar. 19, 2019

(86) PCT No.: PCT/JP2019/011392
§ 371 (c)(1),
(2) Date: Jun. 23, 2021

(87) PCT Pub. No.: WO2020/188732
PCT Pub. Date: Sep. 24, 2020

(65) Prior Publication Data
US 2022/0075180 A1    Mar. 10, 2022

(51) Int. Cl.
G02B 26/08 (2006.01)
B81B 3/00 (2006.01)
G02B 26/10 (2006.01)

(52) U.S. Cl.
CPC .......... *G02B 26/105* (2013.01); *B81B 3/0018* (2013.01); *G02B 26/085* (2013.01); *B81B 2201/042* (2013.01)

(58) Field of Classification Search
CPC .. G02B 26/105; G02B 26/085; B81B 3/0018; B81B 2201/042
See application file for complete search history.

(56) References Cited

U.S. PATENT DOCUMENTS 8,456,727 B2 * 6/2013 Yasuda .............. G02B 26/0858
359/224.1
2014/0368892 A1   12/2014 Mizoguchi

FOREIGN PATENT DOCUMENTS

JP    2004-198647 A    7/2004
JP    2004-252337 A    9/2004
(Continued)

OTHER PUBLICATIONS

International Search Report and Written Opinion mailed on Jun. 11, 2019, received for PCT Application PCT/JP2019/011392, Filed on Mar. 19, 2019, 9 pages including English Translation.

(Continued)

*Primary Examiner* — Euncha P Cherry
(74) *Attorney, Agent, or Firm* — XSENSUS LLP

(57) ABSTRACT

An optical scanning device comprises a scanning structure, an anchor, and a drive unit. The drive unit includes a first drive unit and a second drive unit. The first drive unit includes a first drive beam, an electrode interconnect, paired supports, and a thin film magnet. The first drive beam has a first fixed end connected to the support and a first drive end connected to the scanning structure. The electrode interconnect is formed on the first drive beam. The supports are connected to the anchor and disposed to sandwich the first drive beam. The thin film magnet is disposed on each of the supports. The thin film magnet is disposed in such a manner that a magnetic line of force is generated in a direction intersecting a direction in which the electrode interconnect extends.

10 Claims, 11 Drawing Sheets

(56) References Cited

FOREIGN PATENT DOCUMENTS

| | | |
|---|---|---|
| JP | 2007-14130 A | 1/2007 |
| JP | 2014-240911 A | 12/2014 |
| JP | 2017-167254 A | 9/2017 |
| JP | 2019-41513 A | 3/2019 |
| WO | 2013/124913 A1 | 8/2013 |
| WO | 2018/079669 A1 | 5/2018 |

OTHER PUBLICATIONS

Japanese Office Action issued May 10, 2022, in corresponding Japanese Patent Application No. 2021-506879, 6 pp.

* cited by examiner

OPTICAL SCANNING DEVICE AND METHOD FOR MANUFACTURING THE SAME

CROSS-REFERENCE TO RELATED APPLICATION

The present application is based on PCT filing PCT/JP2019/011392, filed Mar. 19, 2019, the entire contents of which are incorporated herein by reference.

TECHNICAL FIELD

The present invention relates to an optical scanning device and a method for manufacturing the optical scanning device.

BACKGROUND ART

In an optical scanning device such as a laser distance sensor or an optical scanner, MEMS (Micro Electro Mechanical System) technology is applied to employ a MEMS mirror. In order to drive the MEMS mirror, there is a MEMS mirror using electromagnetic force, electrostatic force, or a piezoelectric effect. Scanning of light is implemented by rotating and oscillating the MEMS mirror about a support beam (or an axis).

For example, PTL 1 discloses an optical scanning device having a silicon substrate processed to form a support beam and a movable plate. A drive coil is formed by forming an interconnect on the movable plate. A current is passed through the drive coil. A Lorentz force is generated between the current flowing through the drive coil and a magnetic field of a permanent magnet disposed outside the MEMS mirror. With the Lorentz force as a driving force, the movable plate is rotated about the support beam, whereby light will be scanned.

CITATION LIST

Patent Literature

PTL 1: WO2013/124913

SUMMARY OF INVENTION

Technical Problem

As described above, a conventional optical scanning device is required to have a permanent magnet disposed in order to rotate a MEMS mirror. This is one of factors serving as an obstacle to miniaturization of the optical scanning device.

The present invention has been made to address such an issue, and an object of thereof is to provide an optical scanning device that can be miniaturized, and another object thereof is to provide a method for manufacturing such an optical scanning device.

Solution to Problem

According to the present invention, an optical scanning device comprises a scanning structure, a support body, and one or more drive units. The scanning structure has a reflecting surface to reflect light. The support body is an anchor. The one or more drive units are connected between the scanning structure and the support body to drive the scanning structure. The one or more drive units include a first drive beam, a first electrode interconnect, paired first supports, and a first film magnet. The first drive beam has a first fixed end connected to the support body and a first drive end connected to the scanning structure. The first electrode interconnect is formed on the first drive beam. The paired first supports are each connected to the support body and are also disposed to sandwich the first drive beam. The first film magnet is disposed on each of the paired first supports. The first film magnet is disposed in such a manner that a magnetic line of force is generated in a first direction intersecting a direction in which the first electrode interconnect extends.

According to the present invention, one method for manufacturing an optical scanning device comprises the following steps: A substrate composed of a semiconductor substrate and a semiconductor layer formed on a surface of a body of the semiconductor substrate, with a first insulating film interposed, is prepared. A first electrode interconnect and a reflecting mirror are formed on the semiconductor layer with a second insulating film interposed. A first film magnet is formed on the second insulating film. The second insulating film, the semiconductor layer, the first insulating film, and the body of the semiconductor substrate are processed to form a support body as an anchor, a scanning structure having the reflecting mirror disposed thereon, a first drive beam having the first electrode interconnect disposed thereon, and having one end connected to the support body as a fixed end and the other end connected to the scanning structure as a drive end, and paired first supports each having the first film magnet disposed thereon, and connected to the support body so as to sandwich the first drive beam. In the step of forming the first film magnet, the first film magnet is formed such that a magnetic line of force is generated in a direction intersecting a direction in which the first electrode interconnect extends.

According to the present invention, another method for manufacturing an optical scanning device comprises the following steps: A substrate composed of a semiconductor substrate and a semiconductor layer formed on a surface of a body of the semiconductor substrate, with a first insulating film interposed, is prepared. A first electrode interconnect is formed on the semiconductor layer with a second insulating film interposed. A first film magnet is formed on the second insulating film. The second insulating film, the semiconductor layer, the first insulating film, and the body of the semiconductor substrate are processed to form a support body as an anchor, a first drive beam having the first electrode interconnect disposed thereon, and having one end connected to the support body as a fixed end and the other end as a drive end, and paired first supports each having the first film magnet disposed thereon, and connected to the support body so as to sandwich the first drive beam. A scanning structure having a reflecting mirror disposed thereon is formed. The scanning structure is bonded to the other end of the first drive beam serving as the drive end. In the step of forming the first film magnet, the first film magnet is formed such that a magnetic line of force is generated in a direction intersecting a direction in which the first electrode interconnect extends.

Advantageous Effects of Invention

According the present invention, an optical scanning device is such that a first film magnet disposed in a manner to generate a magnetic line of force in a first direction intersecting a direction in which a first electrode interconnect extends is in the form of film, and the optical scanning device can thus be miniaturized.

According the present invention, one method for manufacturing an optical scanning device is such that a first film magnet formed so as to generate a magnetic line of force in a direction intersecting a direction in which a first electrode interconnect extends is formed of film, and the method allows an optical scanning device that can contribute to miniaturization to be manufactured.

According the present invention, another method for manufacturing an optical scanning device is such that a first film magnet formed so as to generate a magnetic line of force in a direction intersecting a direction in which a first electrode interconnect extends is formed of film and a scanning structure is manufactured separately from a first drive beam etc. and finally bonded to the first drive beam, and the method allows an optical scanning device that can contribute to miniaturization to be manufactured.

DESCRIPTION OF EMBODIMENTS

First Embodiment

Figure 1:
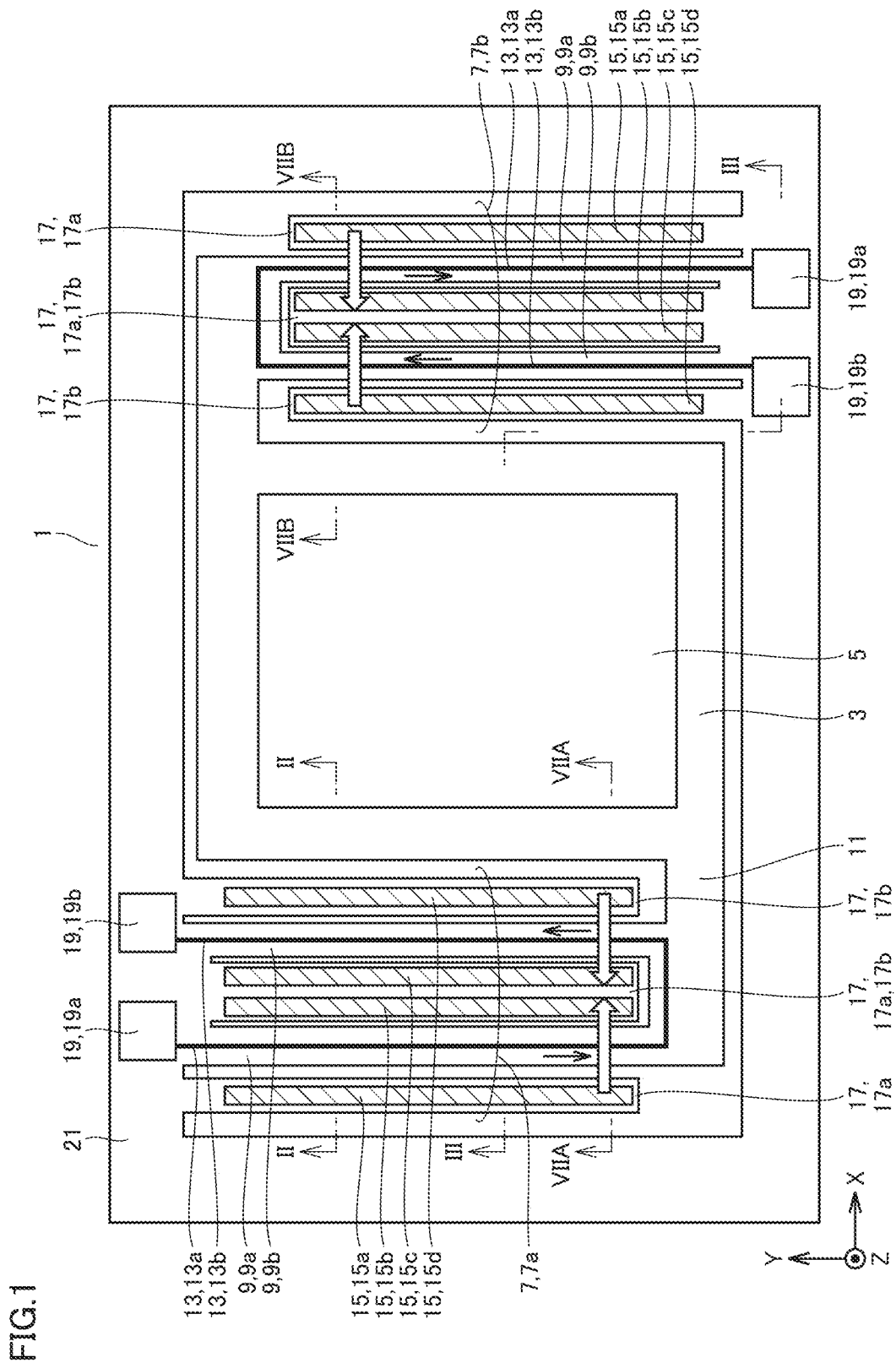
FIG. 1 is a plan view of an optical scanning device according to a first embodiment.
Figure 2:
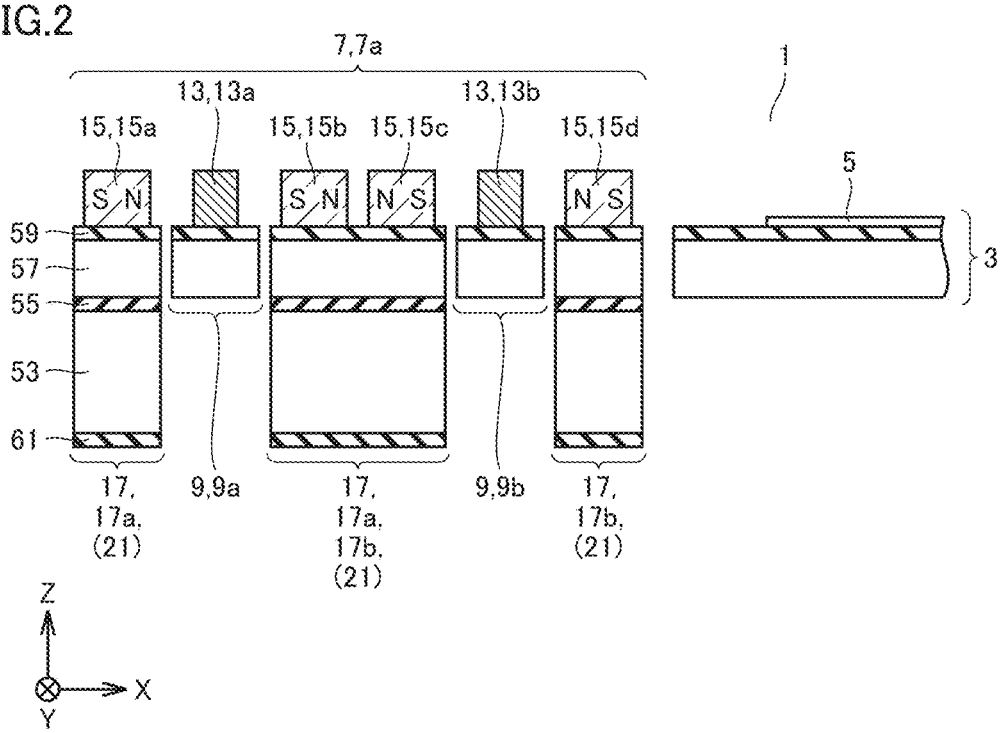
FIG. 2 is a partial cross section taken along a line II-II indicated in FIG. 1 according to the embodiment.

An optical scanning device according to a first embodiment will now be described. As shown in FIGS. 1 and 2, an optical scanning device 1 includes a scanning structure 3, an anchor 21, and a drive unit 7. Drive unit 7 is connected between scanning structure 3 and anchor 21 to drive scanning structure 3. Drive unit 7 includes a drive beam 9, a link beam 11, an electrode interconnect 13, a support 17, and a thin film magnet 15. Drive unit 7 includes a first drive unit 7a and a second drive unit 7b. In the present specification, an X-axis, a Y-axis, and a Z-axis are used as necessary. A surface on which optical scanning device 1 is disposed is defined as an X-Y plane. The Z-axis is orthogonal to the X-Y plane.

Scanning structure 3 is formed substantially in a rectangle in plan view. A reflecting mirror 5 is formed on scanning structure 3. Anchor 21 is formed in the form of a rectangular frame in plan view. Anchor 21 is formed to surround scanning structure 3, drive beam 9, and support 17. Optical scanning device 1 is sized for example to be approximately several hundreds of micrometers to several tens of millimeters.

Drive beam 9 includes a first drive beam 9a and a second drive beam 9b. Drive beam 9 is for example approximately 10 to 3000 μm in width. Drive beam 9 is for example approximately 100 to 20000 μm in length.

First drive beam 9a has a first fixed end and a first drive end, and the first fixed end is connected to anchor 21 and the first drive end is connected via link beam 11 to scanning structure 3 on a negative side along the Y-axis. Second drive beam 9b has a second fixed end and a second drive end, and the second fixed end is connected to anchor 21 and the second drive end is connected to the first drive end and is also connected to via link beam 11 to scanning structure 3 on the negative side along the Y-axis.

Electrode interconnect 13 includes an electrode interconnect 13a as a first electrode interconnect and an electrode interconnect 13b as a second electrode interconnect. Electrode interconnect 13 is formed on drive beam 9 with a silicon oxide film 59 interposed. Electrode interconnect 13 is for example approximately 0.1 to 10 μm in thickness. Silicon oxide film 59 is for example approximately 0.01 to 1 μm in thickness.

Electrode interconnect 13a has one end side electrically connected to an electrode 19a. Electrode interconnect 13b has one end side electrically connected to an electrode 19b. Electrode interconnects 13a and 13b have their respective other end sides electrically interconnected.

Support 17 includes a support 17a as paired first supports, and a support 17b as paired second supports. Supports 17a and 17b are connected to anchor 21.

Thin film magnet 15 includes thin film magnets 15a and 15b as a first film magnet, and thin film magnets 15c and 15d as a second film magnet. Thin film magnets 15a and 15b generate a magnetic line of force in a first direction, which intersects a direction along the Y-axis in which electrode interconnect 13a extends, and it is a positive direction along the X-axis.

Thin film magnets 15c and 15d generate a magnetic line of force in a second direction, which intersects a direction along the Y-axis in which electrode interconnect 13b extends, and it is a negative direction along the X-axis. The first direction and the second direction are directions opposite to each other. In the present specification, thin film magnet 15 is a magnet formed of a film formed through a semiconductor process such as sputtering, CVD (Chemical Vapor Deposition), or the like, and refers to a magnet in the form of a film having a thickness of approximately 100 μm or less, in particular.

Silicon is referred to as a main material for scanning structure 3, drive beam 9, link beam 11, support 17, and anchor 21. As the silicon, for example, silicon of an SOI (Silicon On Insulator) substrate can be applied. Using the SOI substrate allows scanning structure 3, drive beam 9, and link beam 11 to be varied in thickness.

Scanning structure 3 can be set to be larger in thickness to suppress deformation of scanning structure 3. In contrast, drive beam 9 can be set to be smaller in thickness to reduce drive beam 9 in rigidity to displace drive beam 9 in an increased amount. As the silicon, other than single-crystal silicon, polysilicon may be applied for example.

On scanning structure 3, a reflecting mirror 5 is disposed with silicon oxide film 59 interposed. Reflecting mirror 5 is formed of a metal film having a relatively high reflectance. For example, a gold (Au) film is suitable as the metal film having high reflectance. If the gold film is formed directly on a surface of silicon or a silicon oxide film, the gold film may be peeled off the surface of the underlying silicon or the like due to poor adhesion between the gold film and the underlying silicon or the like. In order to suppress this, it is desirable to interpose an adhesion layer between the gold film and the surface of the underlying silicon or the like.

The adhesion layer is preferably a chromium (Cr) film, a stack of a chromium (Cr) film and a nickel (Ni) film, a titanium (Ti) film, a stack of a titanium (Ti) film and a platinum (Pt) film, or the like, for example. Reflecting mirror 5 has a size for example of approximately 100 to 10000 μm in diameter.

The metal film forming reflecting mirror 5 is not limited to gold film, and it may for example be a platinum (Pt) film, a silver (Ag) film, or the like. It is desirable to use a metal film having a higher reflectance depending on the wavelength of light to be used. Furthermore, scanning structure 3 including reflecting mirror 5 may be packaged by vacuum sealing, airtight sealing or the like. In such a case, reflecting mirror 5 may be formed of aluminum (Al) film or a similar, oxidizable metal film.

The metal film is suitably provided by sputtering. Sputtered metal film is considered to be satisfactory in quality as film. Instead of sputtering, vapor deposition may be applied, for example.

As a material for electrode interconnect 13, aluminum (Al) is suitable. As the material for electrode interconnect 13, a material that can pass an electric current suffices, and other than aluminum, aluminum-silicon (Al—Si), gold (Au), or the like may be applied for example.

As a material for electrode 19, gold (Au) is suitable. Electrode 19 is preferably formed through the same process as that for forming reflecting mirror 5. Electrode 19 may be formed through the same process as that for forming electrode interconnect 13.

As a material for thin film magnet 15, NdFeB (neodymium) is suitable. As the material for thin film magnet 15, a material capable of forming a magnetic field suffices, and other than NdFeB (neodymium), SmCo (samarium cobalt), CoPtCr (cobalt platinum chromium), or the like may be applied for example.

Hereinafter, an example of a method for manufacturing optical scanning device 1, as described above, will be described based on a line corresponding to a line indicated in FIG. 1.

Figure 3A:
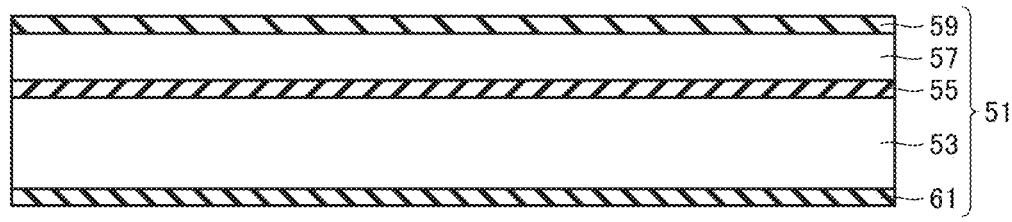
FIG. 3A is a cross section taken along a line corresponding to a line III-III indicated in FIG. 1, showing a step of a method for manufacturing the optical scanning device according to the embodiment.

Initially, as shown in FIG. 3A, an SOI substrate 51 is prepared. For SOI substrate 51, a silicon substrate 53 as a body of a semiconductor substrate has one major surface with a silicon layer 57 formed thereon with a silicon oxide film 55 interposed. A silicon oxide film 59 is further formed on a surface of silicon layer 57. A silicon oxide film 61 is formed on the other major surface of silicon substrate 53. Silicon substrate 53 is for example approximately 100 to 1000 μm in thickness. Silicon layer 57 is for example approximately 2 to 200 μm in thickness.

When silicon oxide films 59 and 61 are not formed on SOI substrate 51, then, in advance, silicon oxide film 59 is formed on a surface of silicon layer 57 and silicon oxide film 61 is formed on the other major surface of silicon substrate 53. Silicon oxide films 59 and 61 are suitably formed through thermal oxidation. Thermal oxidation can form silicon oxide films 59 and 61 with good quality as film. Other than SOI substrate 51 a single-crystal silicon substrate may be used for example. In this case, when etching a back surface of a single-crystal silicon substrate described hereinafter, it is necessary to control the etching by time.

Subsequently, a film (not shown) to be an electrode interconnect is formed for example by sputtering so as to cover silicon oxide film 59. Subsequently, the film to be the electrode interconnect is subjected to photolithography and etched. Suitably, the film is etched by reactive ion etching, for example. For reactive ion etching, a chlorine ($Cl_2$)/argon (Ar)-based gas is suitably used. In the photolithography, a photoresist pattern is formed as a mask (a protective film) for the etching.

Figure 3B:
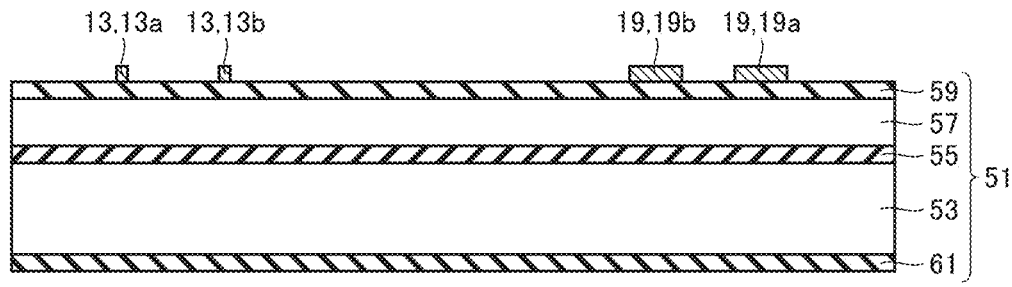
FIG. 3B is a cross section showing a step performed after the step shown in FIG. 3A according to the embodiment.

Thus, as shown in FIG. 3B, electrode interconnect 13 is formed. When electrode interconnect 13 is formed, a portion of electrode 19 is also formed. Other than reactive ion etching, wet etching with an etchant solution may be performed for example. In the etching, it is necessary to set an etching condition under which the underlying silicon oxide film 59 is not easily etched. After electrode interconnect 13 and the like are formed, the photoresist pattern is removed. For removing the photoresist pattern, $O_2$ ashing is suitably used. Alternatively, the photoresist pattern may be removed using a peeling solution.

Figure 3C:
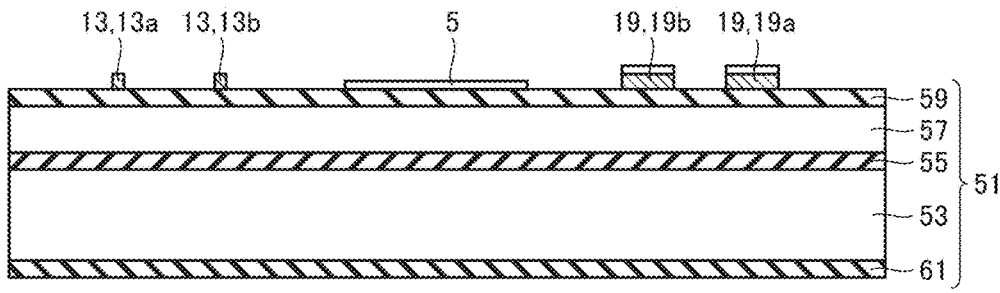
FIG. 3C is a cross section showing a step performed after the step shown in FIG. 3B according to the embodiment.

Subsequently, a film (not shown) to be a reflecting mirror and an electrode is formed so as to cover silicon oxide film 59. Subsequently, photolithography and etching are performed. Thus, as shown in FIG. 3C, reflecting mirror 5 and a remaining portion of electrode 19 are formed. For example, a chromium (Cr) film/nickel (Ni) film/gold (Au) film, a titanium (Ti) film/platinum (Pt) film/gold (Au) film, or a similar film of layers is suitable as the film to be the reflecting mirror and the electrode. Such a film of layers is highly adhesive to an underlying material and also has high reflectance. The film of layers is suitably formed by sputtering.

When a gold (Au) film is formed, wet etching with etchant is preferable. Alternatively, the film to be the reflecting mirror and the electrode may be formed by lifting-off or ion beam etching (IBE). After reflecting mirror 5 and electrode 19 are formed, the photoresist pattern is removed.

In order to prevent electrode interconnect 13 from being etched in the etching when patterning reflecting mirror 5 and electrode 19, it is preferable to form a protective film (not shown) covering electrode interconnect 13 before forming the film to be the reflecting mirror and the electrode. As the protective film, an insulating film of silicon oxide film is suitably used. In order to establish electrical conduction of electrode 19 to electrode interconnect 13, it is necessary to remove a portion of the protective film located under electrode 19.

Further, electrode interconnect 13 and reflecting mirror 5 may be formed simultaneously. In this case, it is preferable to form a film applicable to both electrode interconnect 13 and reflecting mirror 5. It is preferable to form electrode interconnect 13 in accordance with conditions (film type, patterning, etc.) applied in forming reflecting mirror 5.

Figure 3D:
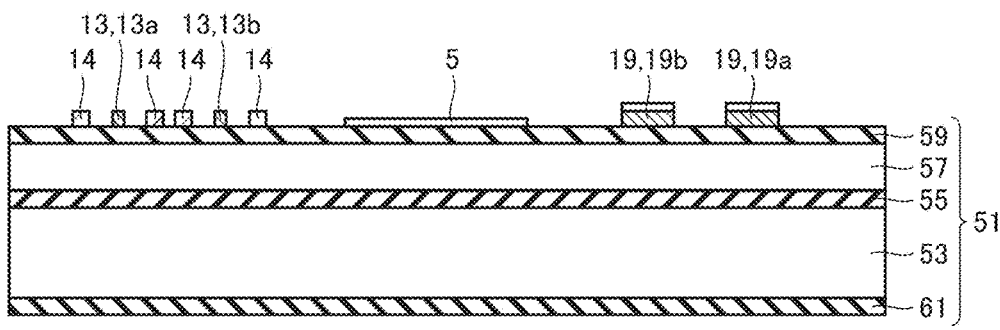
FIG. 3D is a cross section showing a step performed after the step shown in FIG. 3C according to the embodiment.

Subsequently, a film (not shown) to be a thin film magnet is formed so as to cover silicon oxide film 59. The film to be a thin film magnet is suitably formed by sputtering, which allows the film to have good quality as film. Subsequently, as shown in FIG. 3D, a film 14 to be a thin film magnet is patterned to form a pattern of film 14 to be a thin film magnet. Film 14 to be a thin film magnet is suitably patterned by ion beam etching (IBE).

Other than ion beam etching, reactive ion etching may be applied. In this case, it is necessary to set an etching condition under which the underlying silicon oxide film 59 is not easily etched. When reactive ion etching is applied, it is suitable to use chlorine ($Cl_2$)/argon (Ar)-based gas.

Note that when reactive ion etching is used to form thin film magnet 15, then, in order to suppress etching of electrode interconnect 13, reflecting mirror 5 and electrode 19, it is preferable to form a protective film (not shown) covering electrode interconnect 13, reflecting mirror 5 and electrode 19 before forming the film to be a thin film magnet. As the protective film, an insulating film of silicon oxide film is suitably used. After the pattern of film 14 to be a thin film magnet is formed, the protective film covering a surface of reflecting mirror 5 is removed by reactive ion etching in order to reflect light by reflecting mirror 5.

Figure 4A:
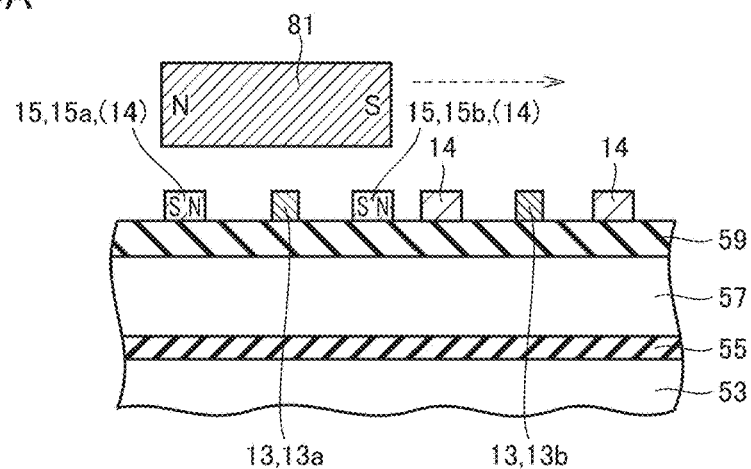
FIG. 4A is a partial cross section showing a step performed after the step shown in FIG. 3D according to the embodiment.
Figure 4B:
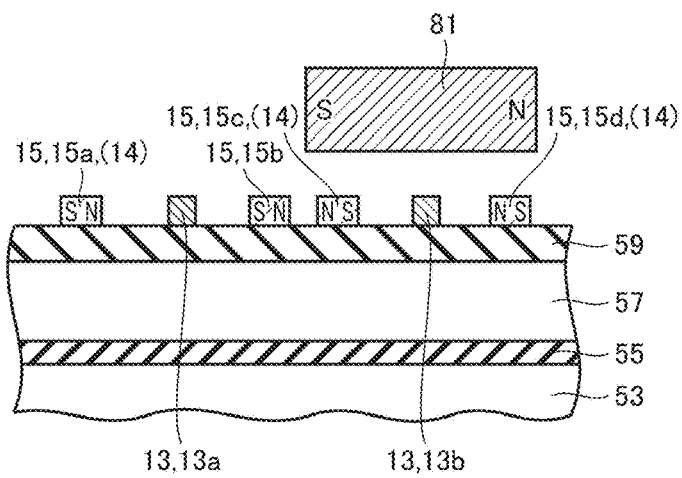
FIG. 4B is a partial cross section showing a step performed after the step shown in FIG. 4A according to the embodiment.

Subsequently, the pattern of film 14 to be a thin film magnet is magnetized to determine a magnetic pole. The pattern is magnetized for example by using a magnetization yoke. As shown in FIGS. 4A and 4B, a magnetization yoke 81 is used to provide magnetization for each pair of patterns of film 14 to be a thin film magnet.

Figure 5:
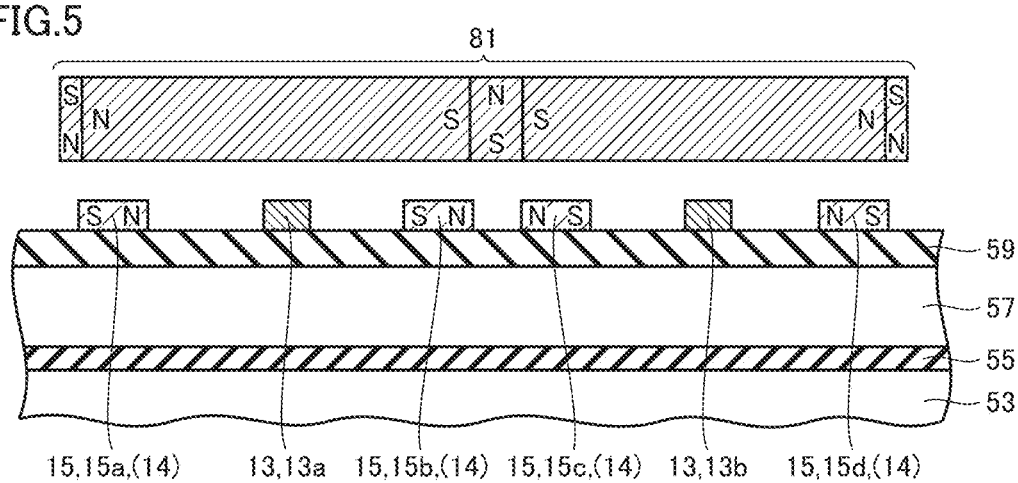
FIG. 5 is a partial cross section showing a modified example of the steps shown in FIGS. 4A and 4B according to the embodiment.

Note that in this case, thin film magnet 15 magnetized for a first time forms a magnetic field, and it is expected that the magnetic field may prevent accurate magnetization of a pattern of film 14 to be a thin film magnet for a second time. Accordingly, as shown in FIG. 5, it is desirable to perform magnetization using magnetization yoke 81 having a Halbach array. The magnetization yoke in the Halbach-array can have a magnetic pole rearranged in direction to concentrate a magnetic field on one side of a magnet, in this case, on a side where the pattern of film 14 to be a thin film magnet is disposed, and the magnetization yoke can thus provide magnetization of thin film magnet 15c to generate a magnetic field opposite in direction to that of thin film magnet 15b. The magnetization may be performed in the step shown in FIG. 6B.

Further, finer magnetization can be achieved when film 14 to be a thin film magnet is locally subjected to heat treatment by local laser annealing or the like. Alternatively, thin film magnet 15 may be separately manufactured and stuck to silicon oxide film 59. When sticking thin film magnet 15, it is preferable that after silicon layer 57 is etched, silicon with thin film magnet 15 formed be bonded to silicon substrate 53 by room temperature bonding.

Further, a protective film may be formed in a region other than a region in which reflecting mirror 5 and electrode 19 are formed. The protective film is preferably a silicon oxide film, an organic film, or the like having resistance to humidity or the like.

Subsequently, a process of forming a structure as an optical scanning device is performed. Initially, photolithography and etching are performed to pattern silicon oxide film 59 (see FIG. 10). Silicon oxide film 59 is suitably patterned by reactive ion etching. Subsequently, silicon layer 57 is etched with the patterned silicon oxide film 59 or the like serving as an etching mask. The layer is suitably etched by inductive coupling plasma (ICP)-RIE. The layer is etched until silicon oxide film 55 has a surface exposed (see FIG. 10).

Figure 6A:
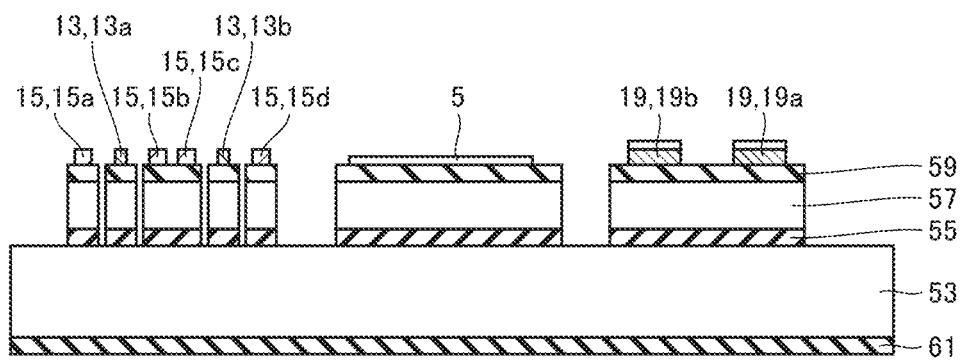
FIG. 6A is a cross section showing a step performed after the step shown in FIG. 4B according to the embodiment.

Subsequently, the exposed silicon oxide film 55 is etched. The film is suitably etched by ICP-RIE continuously with an etching condition varied. Thus, as shown in FIG. 6A, silicon substrate 53 has a surface exposed. This etching may be performed using another reactive ion etching apparatus.

Figure 6B:
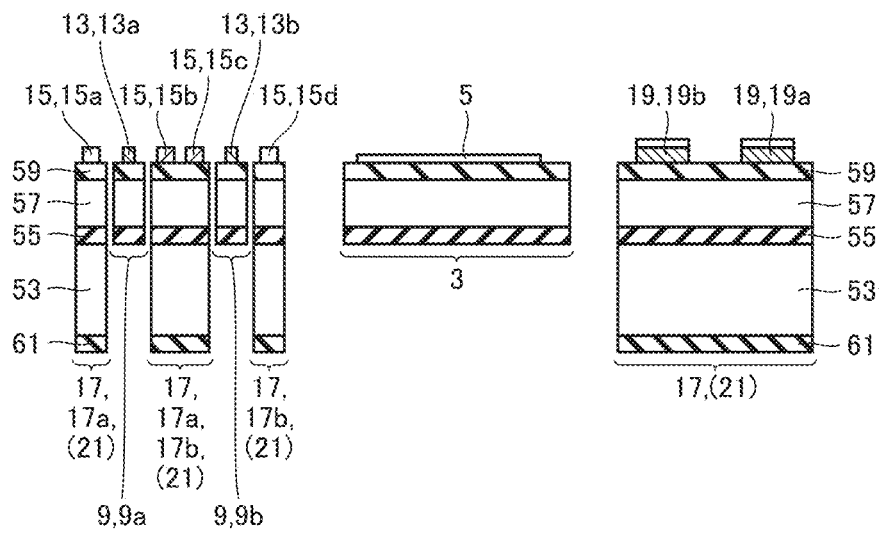
FIG. 6B is a cross section showing a step performed after the step shown in FIG. 6A according to the embodiment.

Subsequently, SOI substrate 51 has a back surface processed. Initially, photolithography and etching are performed to pattern silicon oxide film 61 (see FIG. 11). Subsequently, as shown in FIG. 6B, silicon substrate 53 is etched using the pattern of silicon oxide film 61 or the like as an etching mask. Thus, support 17, drive beam 9, scanning structure 3, and the like are formed. Thereafter, SOI substrate 51 is diced to complete optical scanning device 1 shown in FIG. 1 and the like.

When a wafer-level package or the like is considered as a form of package, then, before SOI substrate 51 is diced, a glass substrate or a silicon substrate may be bonded to the side of the front surface of SOI substrate 51 and that of the back surface of SOI substrate 51 to provide a structure with optical scanning device 1 sealed. SOI substrate 51 and the glass substrate are preferably bonded together by anodic bonding. SOI substrate 51 and the silicon substrate are preferably bonded together at room temperature.

Hereinafter, an example of an operation of optical scanning device 1 will be described. When a current flows through electrode interconnect 13, a Lorentz force is generated in a direction substantially orthogonal to a direction in which the current flows and a direction of a magnetic line of force formed by thin film magnet 15.

As shown in FIG. 1, by thin film magnets 15a and 15b in first drive unit 7a, a magnetic line of force is generated in a direction (a positive direction) along the X-axis. By thin film magnets 15c and 15d, a magnetic line of force is generated in a direction (a negative direction) along the X-axis (see blank arrows). By thin film magnets 15d and 15c in second drive unit 7b, a magnetic line of force is generated in a direction (the positive direction) along the X-axis. By thin film magnets 15b and 15a, a magnetic line of force is generated in a direction (the negative direction) along the X-axis (see blank arrows).

In this condition, for example when a current is passed in first drive unit 7a from electrode 19a to electrode 19b (see arrows), electrode interconnect 13a passes the current in a direction (a negative direction) along the Y-axis. Electrode interconnect 13b passes the current in a direction (a positive direction) along the Y-axis. When a current is passed in second drive unit 7b from electrode 19a to electrode 19b (see arrows), electrode interconnect 13a passes the current in a direction (the positive direction) along the Y-axis. Electrode interconnect 13b passes the current in a direction (the negative direction) along the Y-axis.

Figure 7A:
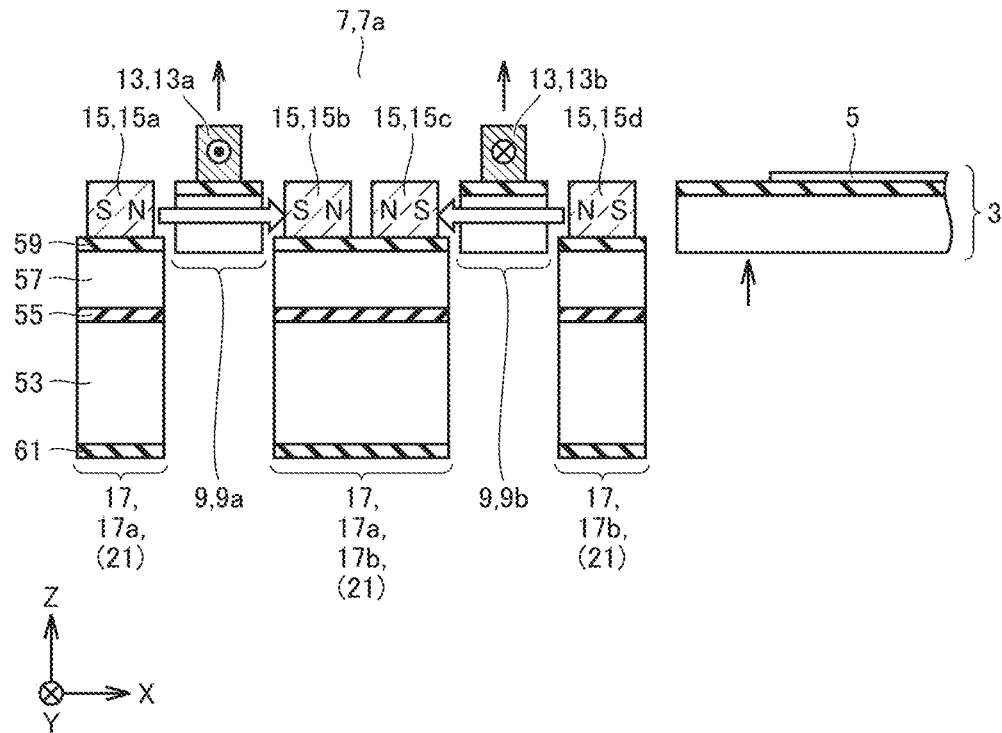
FIG. 7A is a partial cross section taken along a line VIIA-VIIA indicated in FIG. 1 for illustrating an operation of the optical scanning device according to the embodiment.
Figure 7B:
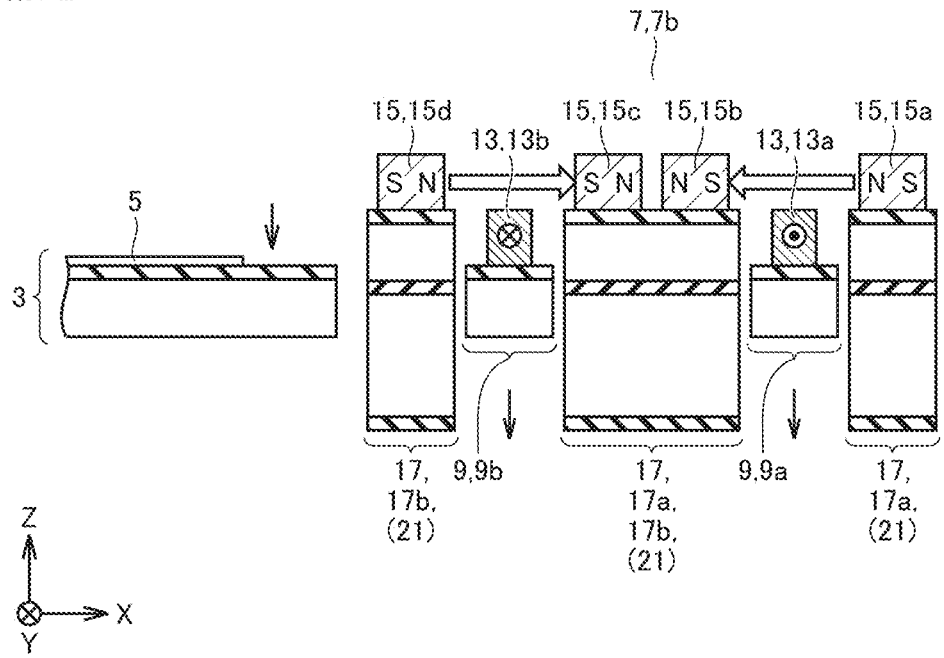
FIG. 7B is a partial cross section taken along a line VIIB-VIIB indicated in FIG. 1 for illustrating an operation of the optical scanning device according to the embodiment.

Then, in this case, as shown in FIG. 7A, in first drive unit 7a, a Lorentz force in a direction (a positive direction) along the Z-axis is generated at first drive beam 9a with electrode interconnect 13a disposed thereon and second drive beam 9b with electrode interconnect 13b disposed thereon (see arrows). In contrast, as shown in FIG. 7B, in second drive unit 7b, a Lorentz force in a direction (a negative direction) along the Z-axis is generated at second drive beam 9b with electrode interconnect 13b disposed thereon and first drive beam 9a with electrode interconnect 13a disposed thereon (see arrows).

Therefore, in first drive unit 7a, the drive end of drive beam 9 is displaced in the positive direction along the Z-axis, and an end of scanning structure 3 on the side of the negative direction along the Y-axis is raised. In contrast, in second drive unit 7b, the drive end of drive beam 9 is displaced in the negative direction along the Z-axis, and an end of scanning structure 3 on the side of the positive direction along the Y-axis direction is lowered. Thus, scanning structure 3 will be inclined with respect to the X-Y plane.

Thus, reflecting mirror 5 formed on scanning structure 3 can be inclined in a desired direction by controlling the direction and intensity of the current passing through electrode interconnects 13a and 13b in first drive unit 7a and the direction and intensity of the current passing through electrode interconnects 13a and 13b in second drive unit 7b.

In optical scanning device 1 described above, a magnetic line of force that causes a Lorentz force to act on drive beam 9 is generated by thin film magnet 15. When this is compared with an optical scanning device with a permanent magnet externally disposed, the former can contribute to miniaturization of optical scanning device 1.

Further, scanning structure 3 can be moved variously by adjusting the frequency and phase of the current passing through electrode interconnects 13a and 13b in first drive unit 7a and those of the current passing through electrode interconnects 13a and 13b in second drive unit 7b. Further, by adjusting link beam 11 in length, drive beam 9 can be separated from reflecting mirror 5, and stray light caused by leakage of light can be reduced.

Second Embodiment

Figure 8:
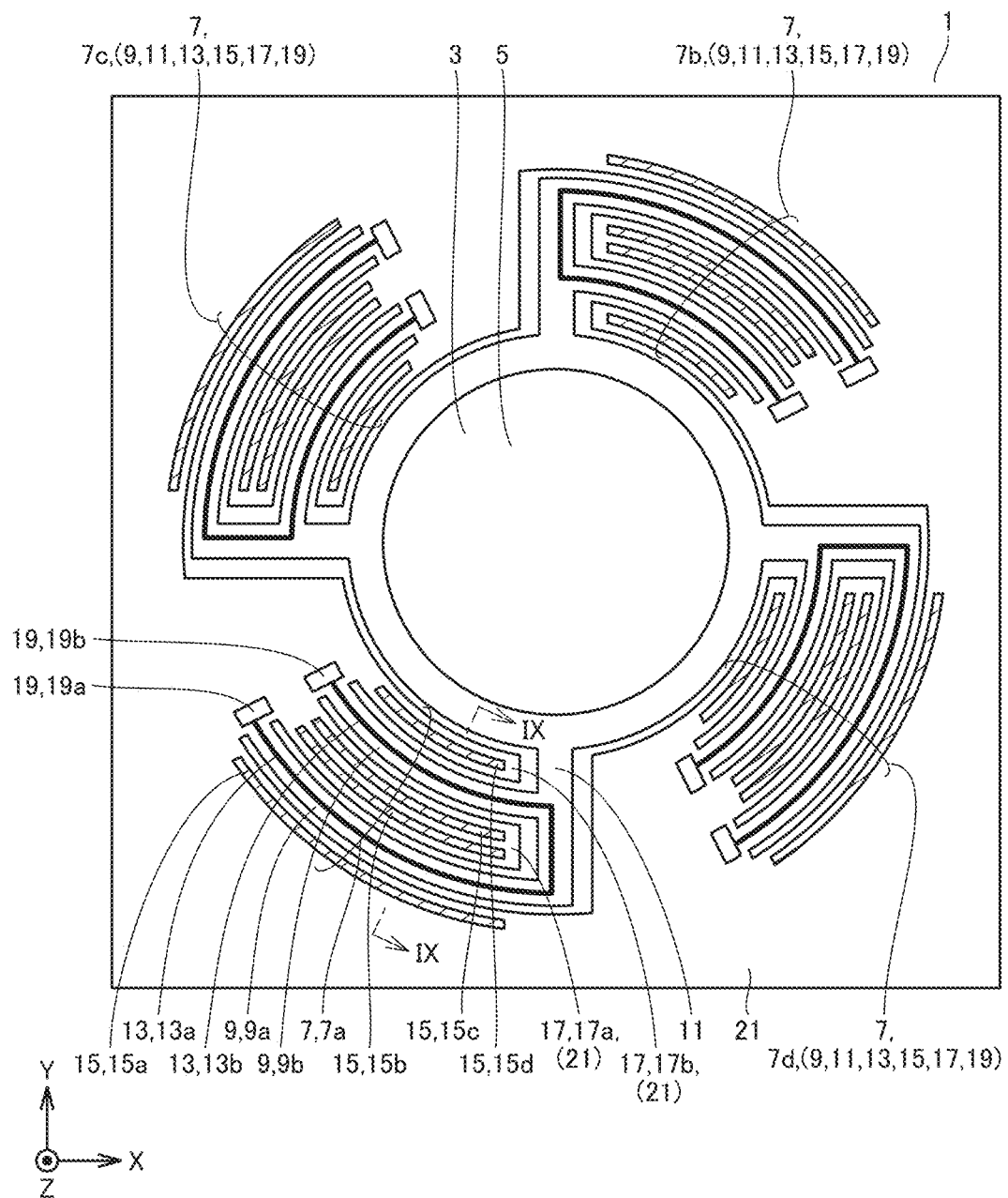
FIG. 8 is a plan view of an optical scanning device according to a second embodiment.
Figure 9:
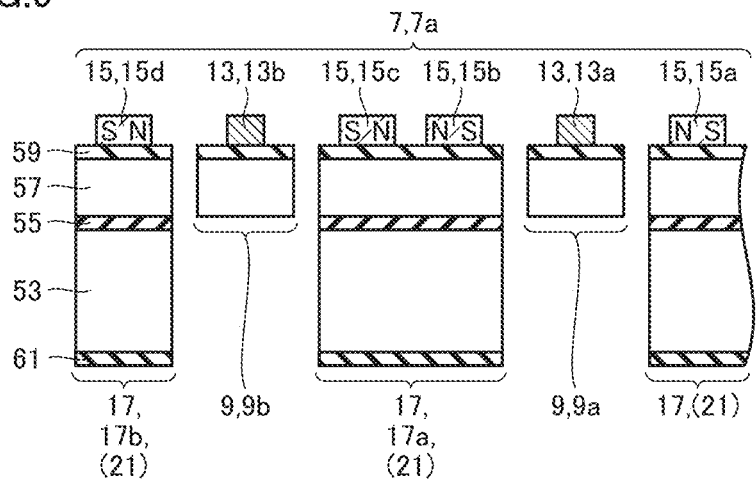
FIG. 9 is a partial cross section taken along a line IX-IX indicated in FIG. 8 according to the embodiment.

An optical scanning device according to a second embodiment will now be described. As shown in FIGS. 8 and 9, optical scanning device 1 includes scanning structure 3, anchor 21, and drive unit 7. Scanning structure 3 and reflecting mirror 5 are substantially circular in shape. Drive unit 7 is connected between the scanning structure and anchor 21 to drive scanning structure 3. Drive unit 7 is formed in an arc along the periphery of circular scanning structure 3. Drive unit 7 includes first drive unit 7a, second drive unit 7b, a third drive unit 7c, and a fourth drive unit 7d.

Drive unit 7 includes drive beam 9, electrode interconnect 13, thin film magnet 15, and support 17. The drive end of drive beam 9, or link beam 11, in first drive unit 7a is connected to a first position along the periphery of scanning structure 3. The drive end of drive beam 9, or link beam 11, in second drive unit 7b is connected to a second position along the periphery of scanning structure 3 that is different from the first position.

The drive end of drive beam 9, or link beam 11, in third drive unit 7c is connected to a third position along the periphery of scanning structure 3 that is different from any one of the first and second positions. The drive end of drive beam 9, or link beam 11, in fourth drive unit 7d is connected to a fourth position along the periphery of scanning structure 3 that is different from any one of the first to third positions. Except for this configuration, the optical scanning device of the present embodiment is similar in configuration to optical scanning device 1 shown in FIG. 1 and the like, and any identical member is identically denoted and will not be described repeatedly unless necessary.

Hereinafter, a method for manufacturing optical scanning device 1 described above will be described. Optical scanning device 1 described above has a basic structure identical to that of optical scanning device 1 previously described, except that the former has scanning structure 3 and drive unit 7 shaped differently than the latter. Therefore, optical scanning device 1 described above can be manufactured in a method composed of substantially the same manufacturing steps as the method for manufacturing optical scanning device 1 previously described, simply with a changed masking pattern.

How optical scanning device 1 described above operates will now be described. As has been discussed above, in drive unit 7, drive beam 9 has the drive end displaced in a direction along the Z-axis by a Lorentz force generated in a direction substantially orthogonal to a direction of a current passing through electrode interconnect 13 and a direction of a magnetic line of force generated by thin film magnet 15. Scanning structure 3 can be moved variously by adjusting the frequency and phase of the current passing through each of electrode interconnects 13a and 13b in each of first to fourth drive units 7a to 7d.

Optical scanning device 1 described above has scanning structure 3 and reflecting mirror 5 in the form of a circle. Optical scanning device 1 is exposed to a laser beam basically in the form of a circular spot. Setting scanning structure 3 and reflecting mirror 5 to have a shape corresponding to the circular spot can minimize scanning structure 3 and reflecting mirror 5 in area, as necessary. This can further contribute to miniaturization of optical scanning device 1.

Further, the laser beam is often incident on reflecting mirror 5 obliquely at an angle of incidence. Therefore, the spot of the laser beam is elliptical on a surface of reflecting mirror 5. Accordingly, reflecting mirror 5 is more preferably shaped elliptically.

Further, optical scanning device 1 described above has first to fourth drive units 7a to 7d each connected at a different position along the periphery of scanning structure 3. This allows scanning structure 3 to also precess and hence optical scanning device 1 to be used in more applications.

While optical scanning device 1 described above has been described with first to fourth drive units 7a to 7d referred to as an example of drive unit 7, drive unit 7 allows scanning structure 3 to precess insofar as drive unit 7 includes at least three drive units.

Third Embodiment

Figure 10:
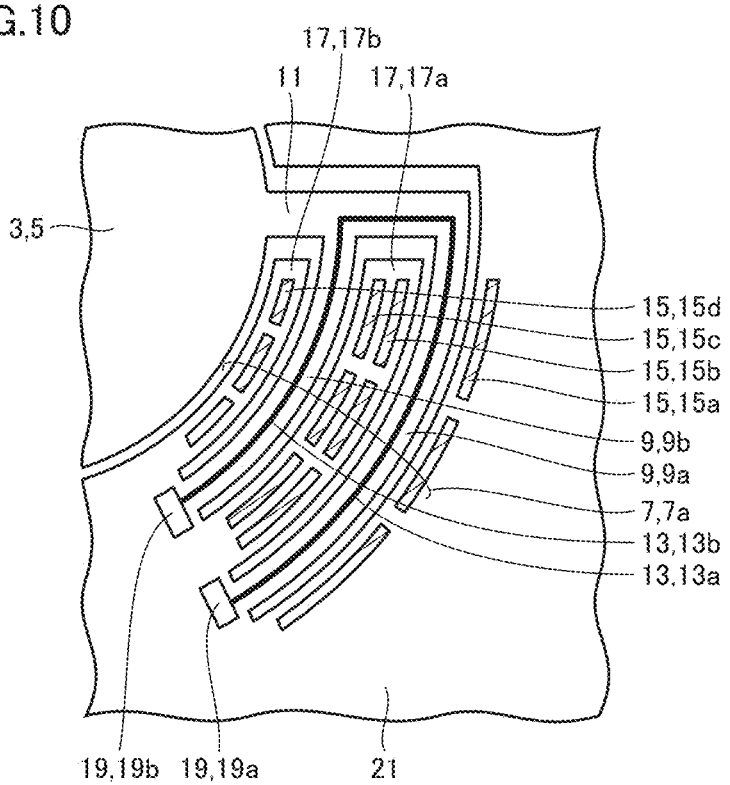
FIG. 10 is a partial plan view of an optical scanning device according to a third embodiment.

An optical scanning device according to a third embodiment will now be described. As shown in FIG. 10, optical scanning device 1 includes thin film magnet 15 such that thin film magnets 15a, 15b, 15c and 15d are disposed along an arc and spaced from one another. That is, thin film magnet 15 is divided into a plurality of pieces, and the plurality of pieces of thin film magnet 15 divided are disposed along electrode interconnect 13.

In FIG. 10, a cross-sectional structure along a line corresponding to line IX-IX indicated in FIG. 8 is the same as the cross-sectional structure shown in FIG. 9. Except for this configuration, the optical scanning device of the present embodiment is similar in configuration to optical scanning device 1 shown in FIG. 8 and the like, and any identical member is identically denoted and will not be described repeatedly unless necessary.

Hereinafter, a method for manufacturing optical scanning device 1 described above will be described. Optical scanning device 1 described above has a basic structure identical to that of optical scanning device 1 described in the first embodiment, except that the former has scanning structure 3 and drive unit 7 including thin film magnet 15 shaped differently than the latter. Therefore, optical scanning device 1 described above can be manufactured in a method composed of substantially the same manufacturing steps as the method for manufacturing optical scanning device 1 previously described, simply with a changed masking pattern.

How optical scanning device 1 described above operates will now be described. As has been discussed in the first embodiment, in drive unit 7, drive beam 9 has the drive end displaced in a direction along the Z-axis by a Lorentz force generated in a direction substantially orthogonal to a direction of a current passing through electrode interconnect 13 and a direction of a magnetic line of force generated by thin film magnet 15. Scanning structure 3 can be moved variously by adjusting the frequency and phase of the current passing through each of electrode interconnects 13a and 13b in each of first drive unit 7a and the like.

In addition to an effect of optical scanning device 1 previously described, optical scanning device 1 described above has an effect as follows: That is, as shown in FIGS. 8 and 10, when film 14 to be a thin film magnet formed in an arc that is divided into a plurality of pieces is compared with film 14 to be a thin film magnet that is not divided, the former, which will be divided, individual thin film magnets, can be reliably magnetized and, as a series of thin film magnets 15, can set a magnetic field in a direction as desired.

Fourth Embodiment

Figure 11:
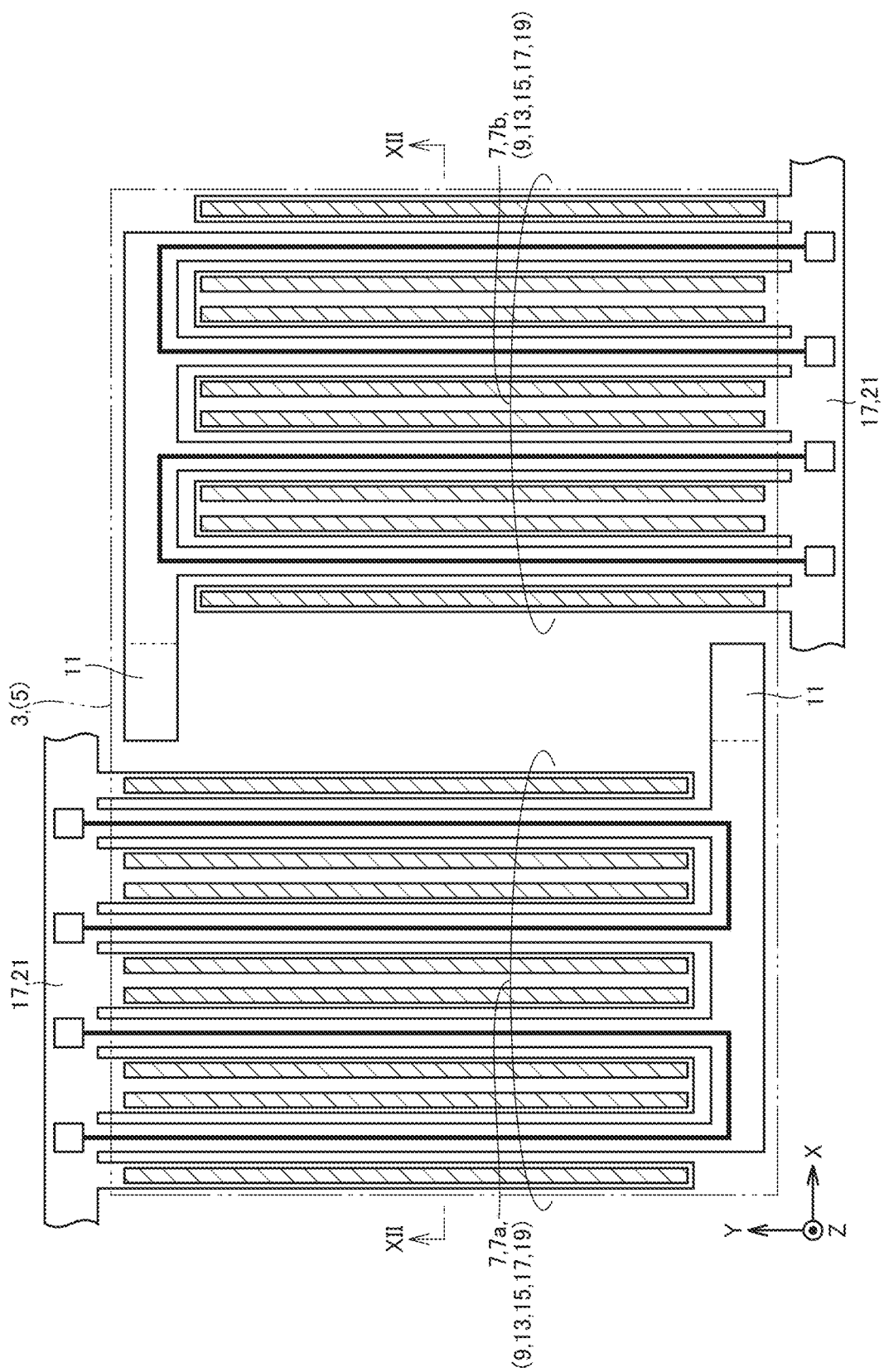
FIG. 11 is a plan view of an optical scanning device according to a fourth embodiment.
Figure 12:
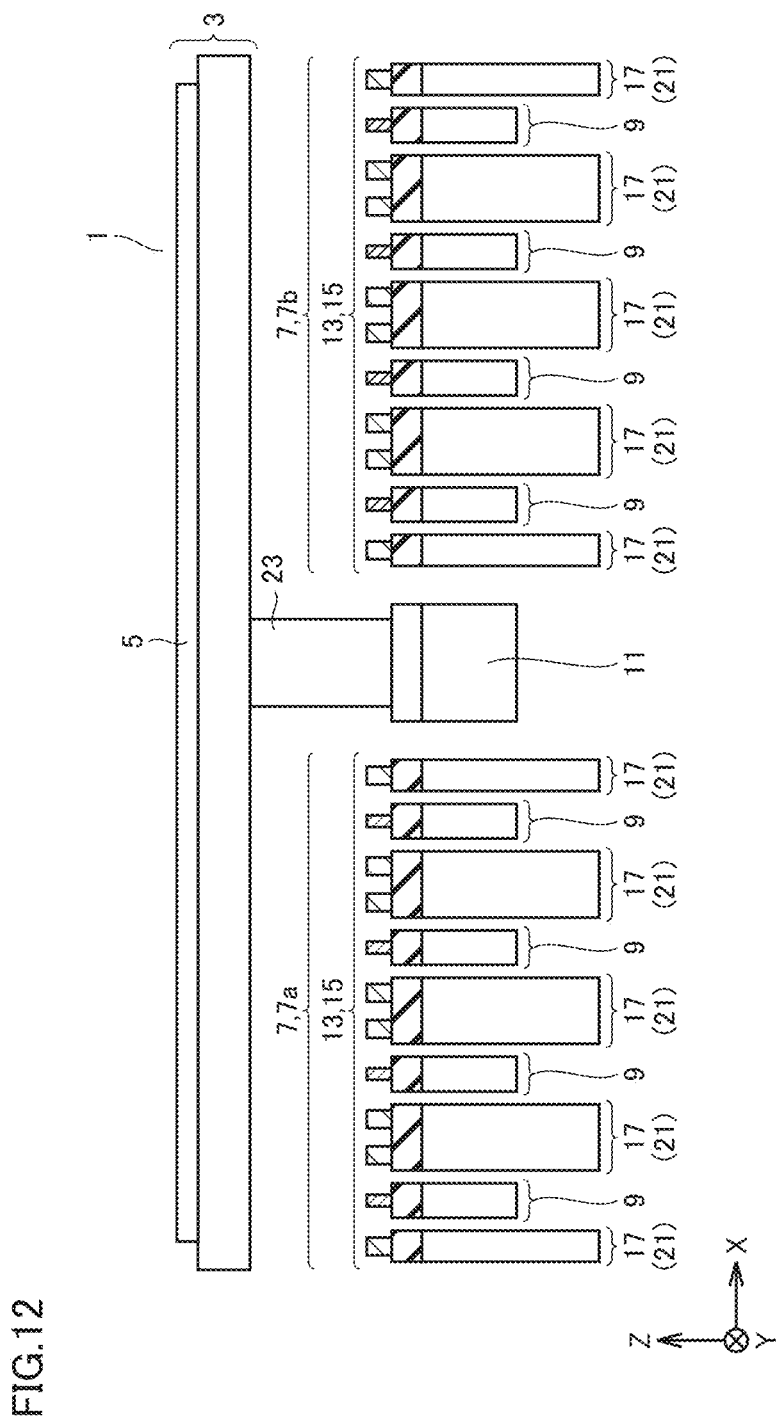
FIG. 12 is a cross section taken along a line XII-XII indicated in FIG. 11 according to the embodiment.

An optical scanning device according to a fourth embodiment will now be described. As shown in FIGS. 11 and 12, optical scanning device 1 is such that scanning structure 3 with reflecting mirror 5 formed thereon is disposed to cover drive unit 7. Drive unit 7 includes first drive unit 7a and second drive unit 7b. First drive unit 7a and second drive unit 7b each have more drive beams 9, more electrode interconnects 13 and more thin film magnets 15 than those corresponding members in optical scanning device 1 shown in FIG. 1 and the like.

An end portion of scanning structure 3 on the side of the negative direction along the Y-axis is connected via a supporting post 23 to link beam 11 connected to the drive end of drive beam 9 in first drive unit 7a. An end portion of scanning structure 3 on the side of the positive direction along the Y-axis is connected via supporting post 23 to link beam 11 connected to the drive end of drive beam 9 in second drive unit 7b. Except for this configuration, the optical scanning device of the present embodiment is similar in configuration to optical scanning device 1 shown in FIG. 1 and the like, and any identical member is identically denoted and will not be described repeatedly unless necessary.

Hereinafter, a method for manufacturing optical scanning device 1 described above will be described. Optical scanning device 1 described above is manufactured through a process similar to that described in the first embodiment, except that scanning structure 3 is formed through a process different from that for forming drive unit 7 and the like. That is, drive unit 7 and the like excluding scanning structure 3 are formed through a process similar to that for optical scanning device 1 described in the first embodiment.

In contrast, scanning structure 3 is separately formed for example by subjecting a silicon substrate or the like to a desired process. Further, supporting post 23 is formed of silicon or the like. Thereafter, scanning structure 3 separately prepared is bonded to link beam 11 of drive unit 7 or the like via supporting post 23. Supporting post 23 and scanning structure 3 are bonded together preferably through room temperature bonding, and so are supporting post 23 and link beam 11. Alternatively, the bonding may be done with an adhesive. Thus, optical scanning device 1 shown in FIGS. 11 and 12 is completed.

How optical scanning device 1 described above operates will now be described. As has been discussed in the first embodiment, in drive unit 7, drive beam 9 has the drive end displaced in a direction along the Z-axis by a Lorentz force generated in a direction substantially orthogonal to a direction of a current passing through electrode interconnect 13 and a direction of a magnetic line of force generated by thin film magnet 15. Reflecting mirror 5 formed on scanning structure 3 can be inclined in a desired direction by adjusting the frequency and phase of a current passing through each of electrode interconnects 13a and 13b in each of first drive unit 7a and second drive unit 7b.

Optical scanning device 1 described above has drive unit 7 disposed so as to be covered with scanning structure 3. This can further contribute to miniaturization of optical scanning device 1.

Figure 13:
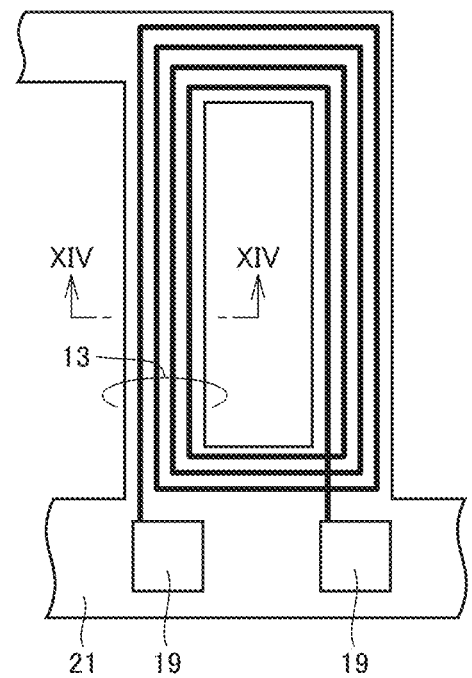
FIG. 13 is a partial plan view showing an exemplary variation of an electrode interconnect according to each embodiment.
Figure 14:
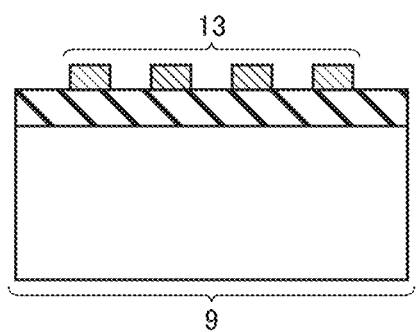
FIG. 14 is a partial cross section taken along a line XIV-XIV indicated in FIG. 13 according to each embodiment.
Figure 15:
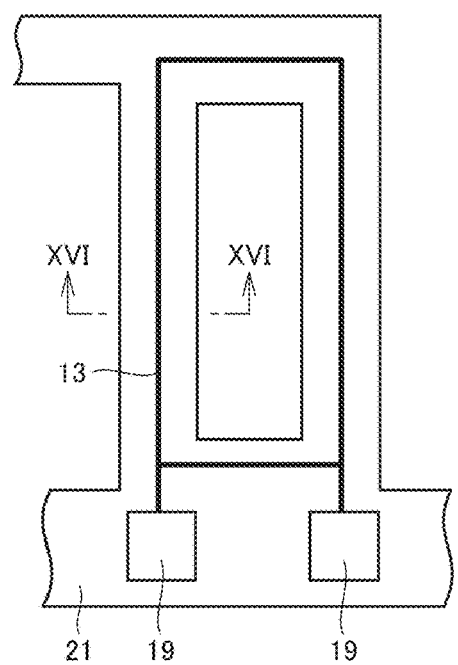
FIG. 15 is a partial plan view showing another exemplary variation of the electrode interconnect according to each embodiment.
Figure 16:
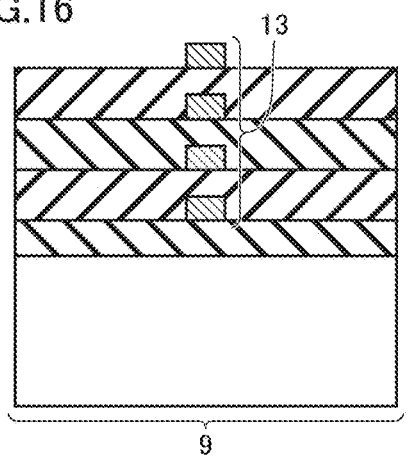
FIG. 16 is a partial cross section taken along a line XVI-XVI indicated in FIG. 15 according to each embodiment.

While optical scanning device 1 according to each of the above-described embodiments has been described with a single interconnect referred to as an example of electrode interconnect 13, electrode interconnect 13 disposed in the form of a coil may be applied as shown in FIGS. 13 and 14. Further, as shown in FIGS. 15 and 16, electrode interconnect 13 may be a stack of layers.

Figure 17:
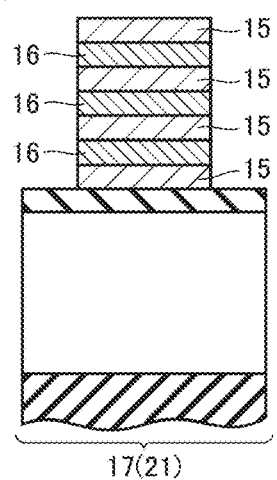
FIG. 17 is a partial cross section showing an exemplary variation of a thin film magnet according to each embodiment.

Further, as thin film magnet 15, thin film magnet 15 formed of film 14 to be a thin film magnet that is a single layer is indicated as an example. As shown in FIG. 17, thin film magnet 15 may for example be a stack of layers composed of one thin film magnet 15 and another thin film magnet 15 with an intermediate layer 16 such as tantalum (Ta) interposed. Thin film magnet 15 in the form of such a stack of layers enables increased magnetic force.

Optical scanning devices 1 described according to the embodiments can be combined variously as required.

The presently disclosed embodiments are illustrative and not restrictive. The scope of the present invention is defined by the terms of the claims, rather than the description above, and is intended to include any modifications within the meaning and scope equivalent to the terms of the claims.

INDUSTRIAL APPLICABILITY

The present invention is effectively applied to optical scanning devices with the MEMS technology applied thereto.

REFERENCE SIGNS LIST 1 optical scanning device, 3 scanning structure, 5 reflecting mirror, 7 drive unit, 7a first drive unit, 7b second drive unit, 7c third drive unit, 7d fourth drive unit, 9, 9a, 9b drive beam, 11 link beam, 13, 13a, 13b, 13c, 13d electrode interconnect, 14 film to be magnet, 15, 15a, 15b, 15c, 15d thin film magnet, 16 intermediate layer, 17, 17a, 17b, support, 19, 19a, 19b electrode, 21 anchor, 23 supporting post, 51 SOI substrate, 53 silicon substrate 55, 59, 61 silicon oxide film, 57 silicon layer, 81 magnetization yoke.

The invention claimed is:

1. An optical scanning device comprising:
    a scanning structure having a reflecting surface to reflect light;
    a support body as an anchor; and
    one or more drive units connected between the scanning structure and the support body to drive the scanning structure,
    the one or more drive units including
        a first drive beam having a first fixed end connected to the support body and a first drive end connected to the scanning structure,
        a first electrode interconnect formed on the first drive beam,
        paired first supports each connected to the support body and also disposed to sandwich the first drive beam,
        a first film magnet disposed on each of the paired first supports,
        a second drive beam having a second fixed end connected to the support body and a second drive end connected to the scanning structure and the first drive end,
        a second electrode interconnect formed on the second drive beam and electrically connected to the first electrode interconnect,
        paired second supports disposed so as to sandwich the second drive beam, and
        a second film magnet disposed on each of the paired second supports,
    the first film magnet being disposed in such a manner that a magnetic line of force is generated in a first direction intersecting a direction in which the first electrode interconnect extends,
    the second film magnet being disposed in such a manner that a magnetic line of force is generated in a second direction intersecting a direction in which the second electrode interconnect extends,
    the first direction and the second direction being opposite to each other,
    a direction of a current passing through the first electrode interconnect and a direction of a current passing through the second electrode interconnect being opposite to each other.

2. The optical scanning device according to claim 1, wherein
    the one or more drive units include
        a first drive unit,
        a second drive unit, and
        a third drive unit,
    the first drive unit is connected between a first position along a periphery of the scanning structure and the support body,
    the second drive unit is connected between a second position along the periphery of the scanning structure and the support body, the second position being different from the first position, and
    the third drive unit is connected between a third position along the periphery of the scanning structure and the support body, the third position being different from the first and second positions.

3. The optical scanning device according to claim 1, wherein
    the first film magnet is divided into a plurality of pieces, and
    the first film magnet divided into the plurality of pieces is aligned in the direction in which the first electrode interconnect extends.

4. The optical scanning device according to claim 1, wherein the scanning structure is disposed to cover the one or more drive units.

5. The optical scanning device according to claim 1, wherein the first electrode interconnect is a plurality of first electrode interconnects disposed between the first film magnet disposed on one of the paired first supports and that disposed on the other of the paired first supports.

6. The optical scanning device according to claim 1, wherein the first film magnet is structured to be a stack of layers.

7. A method for manufacturing an optical scanning device, comprising:
    preparing a substrate composed of a semiconductor substrate and a semiconductor layer formed on a surface of a body of the semiconductor substrate with a first insulating film interposed;
    forming a first electrode interconnect and a second electrode interconnect electrically connected to the first electrode interconnect, and a reflecting mirror on the semiconductor layer with a second insulating film interposed therebetween;
    forming a first film magnet and a second film magnet on the second insulating film; and
    processing the second insulating film, the semiconductor layer, the first insulating film, and the body of the semiconductor substrate to form
        a support body as an anchor,
        a scanning structure having the reflecting mirror disposed thereon,
        a first drive beam having the first electrode interconnect disposed thereon, and having one end connected to the support body as a first fixed end and the other end connected to the scanning structure as a first drive end,
        a second drive beam having the second electrode interconnect disposed thereon, and having one end connected to the support body as a second fixed end and the other end connected as a second drive end to the scanning structure and the first drive end,
        paired first supports each having the first film magnet disposed thereon, and connected to the support body so as to sandwich the first drive beam, and
        paired second supports each having the second film magnet disposed thereon, and connected the support body so as to sandwich the second drive beam,
    in the step of forming the first film magnet, the first film magnet being formed such that a magnetic line of force is generated in a direction intersecting a direction in which the first electrode interconnect extends,
    in the step of forming the second film magnet, the second film magnet being formed in such a manner that a magnetic line of force is generated in a second direction intersecting a direction in which the second electrode interconnect extends, a direction of a current passing through the first electrode interconnect and a direction of a current passing through the second electrode interconnect being opposite to each other.

8. The method for manufacturing an optical scanning device according to claim 7, wherein the step of forming the first film magnet includes:

forming a film to be a magnet so as to sandwich the first electrode interconnect; and magnetizing the film to be the magnet by a magnetization yoke to form the first film magnet.

9. A method for manufacturing an optical scanning device, comprising:

preparing a substrate composed of a semiconductor substrate and a semiconductor layer formed on a surface of a body of the semiconductor substrate with a first insulating film interposed;

forming a first electrode interconnect and a second electrode interconnect electrically connected to the first electrode interconnect on the semiconductor layer with a second insulating film interposed;

forming a first film magnet and a second film magnet on the second insulating film;

processing the second insulating film, the semiconductor layer, the first insulating film, and the body of the semiconductor substrate to form a support body as an anchor, a first drive beam having the first electrode interconnect disposed thereon, and having one end connected to the support body as a first fixed end and the other end as a first drive end, a second drive beam having the second electrode interconnect disposed thereon, and having one end connected to the support body as a second fixed end and the other end connected to the first drive end as a second drive end, paired first supports each having the first film magnet disposed thereon, and connected to the support body so as to sandwich the first drive beam, and paired second supports each having the second film magnet disposed thereon, and connected the support body so as to sandwich the second drive beam;

forming a scanning structure having a reflecting mirror disposed thereon; and bonding the scanning structure to the first drive end of the first drive beam and the second drive end of the second drive beam that are interconnected, in the step of forming the first film magnet, the first film magnet being formed such that a magnetic line of force is generated in a direction intersecting a direction in which the first electrode interconnect extends, in the step of forming the second film magnet, the second film magnet being formed in such a manner that a magnetic line of force is generated in a second direction intersecting a direction in which the second electrode interconnect extends, a direction of a current passing through the first electrode interconnect and a direction of a current passing through the second electrode interconnect being opposite to each other.

10. The method for manufacturing an optical scanning device according to claim 9, wherein the step of forming the first film magnet includes:

forming a film to be a magnet so as to sandwich the first electrode interconnect; and magnetizing the film to be the magnet by a magnetization yoke to form the first film magnet.

* * * * *